US012776805B2

(12) United States Patent
Jaklitsch et al.

(10) Patent No.: US 12,776,805 B2
(45) Date of Patent: Oct. 27, 2026

(54) SYNTHESIZING COMPOSITE SIGNALS

(71) Applicant: Textron Systems Corporation, Hunt Valley, MD (US)

(72) Inventors: James Joseph Jaklitsch, Parkton, MD (US); Jay Michael Markey, York, PA (US)

(73) Assignee: Textron Systems Corporation, Hunt Valley, MD (US)

(*) Notice: Subject to any disclaimer, the term of this patent is extended or adjusted under 35 U.S.C. 154(b) by 283 days.

(21) Appl. No.: 18/743,689

(22) Filed: Jun. 14, 2024

(65) Prior Publication Data

US 2024/0421847 A1 Dec. 19, 2024

Related U.S. Application Data

(60) Provisional application No. 63/472,964, filed on Jun. 14, 2023.

(51) Int. Cl.
*H04B 1/68* (2006.01)
*H03C 1/60* (2006.01)
*H04L 27/04* (2006.01)

(52) U.S. Cl.
CPC ................. *H04B 1/68* (2013.01); *H03C 1/60* (2013.01); *H04L 27/04* (2013.01)

(58) Field of Classification Search
CPC ....... G06F 1/0328; H04B 1/68; H04B 14/002; H04B 1/0003; H04B 2001/0491; H03C 1/60; H04L 27/04; H04L 27/122; H04L 27/24
See application file for complete search history.

(56) References Cited

U.S. PATENT DOCUMENTS

| | | | | |
|---|---|---|---|---|
| 5,519,732 | A | 5/1996 | Chester | |
| 5,596,570 | A * | 1/1997 | Soliman ............ | H04B 17/3912 370/335 |
| 6,570,458 | B2 | 5/2003 | Cuddy | |

(Continued)

OTHER PUBLICATIONS

International Search Report and Written Opinion for PCT application No. PCT/2024/034036, dated Oct. 2, 2024, 12 pages.

*Primary Examiner* — Congvan Tran
(74) *Attorney, Agent, or Firm* — BainwoodHuang

(57) ABSTRACT

A technique for generating electronic signals includes processing a respective first-level input signal by each of a plurality of first-level channels, including up-sampling the respective first-level input signal and single-sideband (SSB) modulating the up-sampled first-level input signal to produce a respective first-level output signal. The technique further includes processing a respective second-level input signal by each of a plurality of second-level channels, including up-sampling the respective second-level input signal and SSB-modulating the up-sampled second-level input signal to produce a respective second-level output signal. The plurality of second-level channels is arranged in multiple groups assigned to respective first-level channels, and the technique further includes (i) summing together the second-level output signals of the second-level channels in each group, (ii) providing a group sum as the first-level input signal to the first-level channel to which the group is assigned, and summing together the first-level output signals to provide a composite signal.

20 Claims, 6 Drawing Sheets

(56) References Cited

U.S. PATENT DOCUMENTS

| | | | | |
|---|---|---|---|---|
| 7,395,289 | B2 | 7/2008 | Shiung | |
| 7,545,224 | B2 | 6/2009 | Chow et al. | |
| 8,384,440 | B2 | 2/2013 | Tessarolo et al. | |
| 8,768,268 | B2 | 7/2014 | Mo et al. | |
| 8,970,276 | B1 | 3/2015 | Mcshea et al. | |
| 9,071,234 | B2 | 6/2015 | Gunn et al. | |
| 9,091,724 | B2 | 7/2015 | Ortler et al. | |
| 9,198,150 | B2 | 11/2015 | Gunn | |
| 9,397,667 | B2 | 7/2016 | Ingimundarson | |
| 9,397,675 | B1 | 7/2016 | Goodson et al. | |
| 9,531,430 | B2 | 12/2016 | Morche et al. | |
| 9,571,112 | B2 | 2/2017 | Kushnir et al. | |
| 10,012,694 | B2 | 7/2018 | Jaklitsch et al. | |
| 10,177,747 | B2 | 1/2019 | Tessarolo et al. | |
| 10,333,532 | B2 | 6/2019 | Satoh | |
| 11,204,620 | B2 | 12/2021 | D'Angelo | |
| 11,563,444 | B1 | 1/2023 | Jaklitsch | |
| 2005/0135524 | A1 | 6/2005 | Messier | |
| 2016/0248497 | A1 | 8/2016 | Armstrong et al. | |
| 2024/0380374 | A1* | 11/2024 | Quan | H04R 29/004 |
| 2026/0067028 | A1* | 3/2026 | Kim | H03M 13/13 |

* cited by examiner

For Spectral Fill ≤ 16%

For Spectral Fill > 16% and ≤ 32%

SYNTHESIZING COMPOSITE SIGNALS

CROSS-REFERENCE TO RELATED APPLICATIONS

This application claims the benefit of U.S. Provisional Patent Application No. 63/472,964, filed Jun. 14, 2023, the contents and teachings of which are incorporated herein by reference in their entirety.

BACKGROUND

This invention is directed generally to the field of electronics, and more specifically to an efficient technique for generating a multiplicity of communications signals on a common set of hardware.

Frequency synthesizers find many applications in the areas of test and simulation of communication systems and devices, such as those used in cellular communications and command and control. A typical synthesizer uses a direct digital synthesis (DDS) approach, in which a phase accumulator increments by a specified phase value (the frequency tuning word) on each clock cycle. Output of the phase accumulator is fed to a sine lookup table, which outputs digital sine values corresponding to the accumulated phase. A digital-to-analog converter (DAC) converts the sine values to an analog signal, and a low-pass (or band-pass) filter smooths the analog signal to provide a low-distortion sinusoidal waveform. By varying the frequency tuning word, the output frequency of the DDS can be varied in fine increments, which are typically fractions of a Hertz.

Some test and simulation instruments include multiple synthesizer channels. A separate DDS is provided for each channel, and the DDSs are configured to operate in parallel. In some cases, outputs from the separate DDS channels are combined to produce composite signals.

SUMMARY

Certain embodiments are directed to a synthesizer for generating electronic signals. The synthesizer includes a plurality of first-level channels, each of the plurality of first-level channels constructed and arranged to up-sample and single-sideband (SSB) modulate a respective first-level input signal to produce a respective first-level output signal. The synthesizer further includes a plurality of second-level channels, each of the plurality of second-level channels constructed and arranged to up-sample and SSB-modulate a respective second-level input signal to produce a respective second-level output signal. The plurality of second-level channels is arranged in multiple groups wherein each group is provided for a respective first-level channel and includes multiple second-level channels whose second-level output signals combine to provide the first-level input signal of the respective first-level channel. The synthesizer 100 still further includes a summer constructed and arranged to sum together the first-level output signals to produce a composite output signal.

In some examples, the composite output signal has a first bandwidth range, the first-level input signal of each first-level channel has a second bandwidth range that is narrower than the first bandwidth range, and each first-level channel is further constructed and arranged to place the respective first-level input signal within a respective subrange of the first bandwidth range of the composite signal.

In some examples, each second-level channel in a group is constructed and arranged to receive a second-level input signal having a third bandwidth range that is narrower than the second bandwidth range, and each second-level channel in the group is further constructed and arranged to place the respective second-level input signal within a respective subrange of the second bandwidth range.

In some examples, each of the plurality of first-level channels includes an up-sampler configured to multiply a sampling rate of the respective first-level input signal to produce a respective up-sampled first-level input signal, an oscillator that includes (i) an address sequencer configured to cycle through a sequence of stored values and (ii) a set of lookup tables that associates the stored values with respective sinusoidal values, and an SSB modulator having inputs configured to receive the up-sampled first-level input signal and the sinusoidal values and an output configured to produce the respective first-level output signal.

In some examples, each of the plurality of first-level channels and each of the plurality of second-level channels respectively includes an oscillator that includes (i) an address sequencer configured to cycle through a sequence of stored values and (ii) a set of lookup tables that associates the stored values with respective sinusoidal values.

In some examples, the stored values correspond to phase, and the address sequencer is constructed and arranged to output the values at a consistent clock rate.

In some examples, the address sequencer is constructed and arranged to output a value at a first address after outputting a value from a last address, such that the address sequencer operates in a continuous loop.

In some examples, the oscillator is programmable for producing different frequencies of sinusoids by storing different numbers of 360-degree phase cycles in the stored values.

In some examples, the synthesizer further includes an input circuit constructed and arranged to produce the second-level input signal of a second-level channel of the plurality of second-level channels, the input circuit including a direct digital synthesizer (DDS) constructed and arranged to generate a sub-carrier frequency having a frequency resolution, wherein a component of the composite output signal contributed by the second-level channel has the same frequency resolution as the sub-carrier frequency produced by the DDS.

In some examples, the synthesizer further includes: an up-sampler constructed and arranged to receive the composite output signal and to multiply a sampling rate of the composite output signal to provide an upsampled composite signal; a carrier DDS constructed and arranged to modulate the up-sampled composite signal on a carrier frequency; and a digital-to-analog converter constructed and arranged to convert the modulated, up-sampled composite signal to an analog signal.

In some examples, the modulator includes a local oscillator constructed and arranged to generate the carrier signal, the local oscillator including (i) an address sequencer configured to cycle through a sequence of stored values and (ii) a set of lookup tables that associates the stored values with respective sinusoidal values.

In some examples, the synthesizer further includes an input circuit constructed and arranged to produce the second-level input signal of a second-level channel of the plurality of second-level channels. The input circuit includes: a direct digital synthesizer (DDS) constructed and arranged to generate a sub-carrier frequency; a digital fine delay (DFD) circuit having an input coupled to a signal source for receiving an input signal having a sampling period; and an SSB modulator having a first input coupled to the DFD circuit, a second input coupled to the DDS, and an output coupled to the second-level channel for providing the second-level input signal. The DFD circuit is constructed and arranged to selectively delay the input signal by time increments that are less than one percent of the sampling period of the input signal.

In some examples, the synthesizer further includes a digital fine delay (DFD) circuit having an input coupled to a signal source for receiving an input signal and an output coupled to one of the second-level channels for providing a delayed signal. The DFD circuit includes: a FIFO (first-in, first out buffer), the FIFO having an input configured to receive successive samples of the input signal and an output configured to provide delayed versions of the successive samples; a unit-delay circuit having an input and an output, the input of the unit-delay circuit coupled to the output of the FIFO; and a linear time interpolator having a first input coupled to the output of the FIFO, a second input coupled to the output of the unit-delay circuit, a third input providing a control signal for selecting a desired delay, and an output configured to provide the delayed signal delayed by an amount of time based on the control signal.

In some examples, the input signal provided to the input of the DFD circuit has a spectral fill that does not exceed 16%.

In some examples, the synthesizer further includes a digital fine delay (DFD) circuit having an input coupled to a signal source for receiving an input signal and an output coupled to one of the first-level channels for providing a delayed signal. The input signal has a spectral fill between 16% and 32%, and the DFD circuit includes: a FIFO (first-in, first out buffer), the FIFO having an input configured to receive successive samples of the input signal and an output configured to provide delayed versions of the successive samples; a first unit-delay circuit having an input and an output, the input of the unit-delay circuit coupled to the output of the FIFO; a second unit-delay circuit having an input and an output, the input of the second unit-delay circuit coupled to the output of the first unit-delay circuit; and a quadratic time interpolator having (i) a first input coupled to the output of the FIFO, (ii) a second input coupled to the output of the first unit-delay circuit, (iii) a third input coupled to the output of the second unit-delay circuit, and (iv) a fourth input providing a control signal for selecting a desired delay, the quadratic time interpolator further having an output configured to provide the delayed signal delayed by an amount of time based on the control signal.

Other embodiments are directed to a method of generating electronic signals. The method includes processing a respective first-level input signal by each of a plurality of first-level channels, said processing including up-sampling the respective first-level input signal and single-sideband (SSB) modulating the up-sampled first-level input signal to produce a respective first-level output signal. The method further includes processing a respective second-level input signal by each of a plurality of second-level channels, said processing including up-sampling the respective second-level input signal and SSB-modulating the up-sampled second-level input signal to produce a respective second-level output signal. The plurality of second-level channels is arranged in multiple groups assigned to respective first-level channels, and the method further includes (i) summing together the second-level output signals of the second-level channels in each group to produce a respective group sum, (ii) providing the group sum as the first-level input signal to the first-level channel to which the group is assigned, and summing together the first-level output signals of the plurality of first-level channels to provide a composite output signal.

In some examples, the composite output signal has a first bandwidth range, and the method further include: generating the second-level input signal of a particular second-level channel of the plurality of second-level channels, said generating including modulating an input signal using a sub-carrier having a frequency resolution; and processing the second-level input signal by the particular second-level channel and an associated first-level channel to appear within a sub-range of the first bandwidth range of the composite output signal. The second-level input signal appearing within the sub-range of the first bandwidth range of the composite output signal has the same frequency resolution as the sub-carrier.

In some examples, generating the second-level input signal of the particular second-level channel further includes delaying the input signal by programmable increments that are less than one percent of the sampling period of the input signal, wherein delaying the input signal by the programmable increments causes the second-level input signal appearing within the sub-range of the first bandwidth range of the composite output signal to be delayed by equal increments.

In some examples, SSB-modulating each up-sampled first-level input signal includes generating a respective sub-carrier frequency, and generating the respective sub-carrier frequency for a particular first-level channel includes cycling through a sequence of stored values that correspond to a first number of sinusoidal cycles and converting the sequence of stored values to a set of sinusoids having a frequency based on the first number.

In some examples, the method further includes varying the sub-carrier frequency of the particular first-level channel by storing values that correspond to a second number of sinusoidal cycles different from the first number.

Still other embodiments are directed to a computer program product. The computer program product stores instructions which, when executed in an electronic instrument, cause the instrument to perform a method of generating electronic signals, such as the method described above.

Other embodiments are directed to apparatus, methods, and computer program products for providing a simplified DDS as described herein, and for providing one or more digital fine delay (DFD) circuits, as described herein.

The foregoing summary is presented for illustrative purposes to assist the reader in readily grasping example features presented herein; however, this summary is not intended to set forth required elements or to limit embodiments hereof in any way. One should appreciate that the above-described features can be combined in any manner that makes technological sense, and that all such combinations are intended to be disclosed herein, regardless of whether such combinations are identified explicitly or not.

BRIEF DESCRIPTION OF THE SEVERAL VIEWS OF THE DRAWINGS

The foregoing and other features and advantages will be apparent from the following description of particular embodiments, as illustrated in the accompanying drawings, in which like reference characters refer to the same or similar parts throughout the different views. The drawings are not necessarily to scale, emphasis instead being placed upon illustrating the principles of various embodiments.

DETAILED DESCRIPTION

Figure 1:
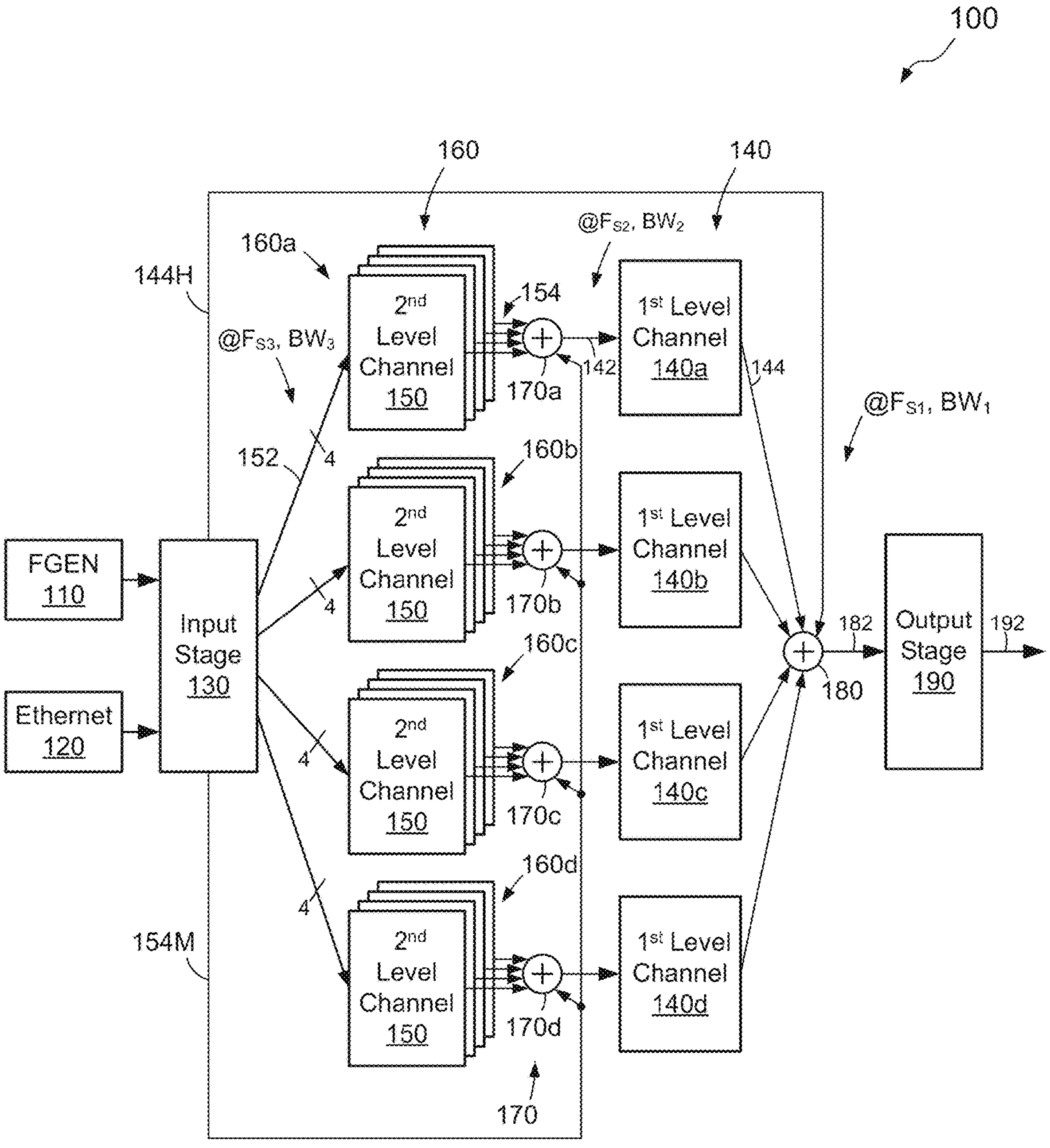
FIG. 1 is a block diagram of an example synthesizer for generating electronic signals according to certain embodiments.

Embodiments of the improved technique will now be described. One should appreciate that such embodiments are provided by way of example to illustrate certain features and principles but are not intended to be limiting.

Test and simulation instruments have finite resources for performing digital signal processing (DSP). Such resources may be limited in some examples to one or more FPGAs (field-programmable gate arrays). As a result, the total number of synthesizer channels that a single instrument can contain is typically no greater than four. New applications have arisen, however, that demand higher numbers of synthesizer channels. For example, some applications aim to test or simulate environments having a multitude of communication signals, such as a large number of cell phone conversations that one may find in a city or other population center. Although multiple instruments may meet this demand by operating in parallel, hardware resources, space requirements, cooling, and costs quickly become prohibitive as the number of instruments increases. What is needed, therefore, is a way of providing larger numbers of synthesizer channels per instrument, such that fewer instruments are needed to meet demands.

The above need is addressed at least in part by an improved technique of generating communication signals. The technique includes preparing a multitude of communication signals at relatively low sampling rates and then upsampling, modulating, and combining the signals in successive stages at successively higher sampling rates. Although processing higher sampling-rate signals is more resource-intensive than processing lower sampling-rate signals, there are fewer higher sampling-rate signals, such that the resources required overall are much less than would be needed if each communication signal were prepared independently at the higher sampling rate.

In some examples, additional features and improvements promote further efficiency, leveraging even greater parallelism. Such improvements may be considered herein to be independent improvements, as well as features of the disclosed technique summarized above.

As one example, a simplified DDS is presented, which is particularly suitable for high sampling rates. The simplified DDS does not require a phase accumulator and its associated arithmetic operations but rather uses an address sequencer to cycle through phase values stored in memory. The frequency resolution of the simplified DDS is typically lower than that of a conventional DDS, but high frequency resolution is not always needed. For example, in the disclosed embodiments, arbitrarily fine frequency resolution can still be achieved in the lower sampling-rate stages. As outputs from multiple stages are combined in the composite output, the finer resolution provided at the lower sampling rates is preserved in the composite output, with no loss of performance.

As another example, a digital fine delay (DFD) is provided for individual synthesizer channels. The DFD is configured to delay samples of an input signal by time increments that are much shorter than the time between successive samples of the input signal. The DFD includes a FIFO for receiving samples of the input signal and for regularizing the samples in time, such that the time intervals between successive samples coming out of the FIFO are uniform (the FIFO may be omitted if regularity of the samples is otherwise achieved). The DFD further includes one or more unit-delays ($z-1$) and an interpolator. A single unit-delay may be provided for linear interpolation, and two unit-delays may be provided in series for quadratic interpolation. The interpolator receives the input and output of each unit delay and connects the samples using a line (for linear interpolation) or a parabola (for quadratic interpolation). Higher order interpolators may be used with greater numbers of unit-delays; however, resource requirements are greater as the order increases. Time delays imposed by a DFD at lower frequencies may be reflected directly in the composite output signal at higher frequencies.

Turning now to the figures, FIG. 1 shows an example synthesizer 100 in which embodiments of the improved technique can be practiced. The synthesizer 100 may be provided as part of an electronic instrument used for test and/or simulation of communication signals, and may be realized in whole or in part using one or more FPGAs, which in some examples may be limited to a single FPGA.

In the example shown, the synthesizer 100 includes an on-board function generator 110 and/or streaming Ethernet connection 120, which are configured to provide individual communication signals, such as a total of 32 communication signals in the depicted example. The communication signals may cover a range of sampling rates and bandwidths.

An input stage 130 is configured to receive the communication signals and to process them individually. For example, the input stage 130 is configured to selectively up-sample certain communication signals to specified sampling rates, such that the up-sampled signals can be added to other signals having the same sampling rates. The input stage 130 may also be configured to modulate the signals onto sub-carrier frequencies having high frequency resolution (e.g., $1/16^{th}$ Hz). In addition, the input stage 130 may simulate Doppler effects and apply fine timing delays, e.g., using the above-described DFD.

First-level channels 140 and second-level channels 150 are configured to perform up-sampling and single side-band (SSB) modulation of their respective inputs. In the example shown, the synthesizer 100 includes four first-level channels, labeled 140*a* through 140*d*, but four channels are merely an example. Each first-level channel 140 is configured to receive a respective first-level input signal 142 and to provide a respective first-level output signal 144. Some examples may further include a switch matrix (not shown), which is configured to switch communication signals processed by the input stage 130 to the first and/or second-level channels and to add together certain communications signals that have the same sampling rate.

For each first-level channel 140, the synthesizer 100 includes a respective group 160 of second-level channels 150. In the example, four groups 160 (160*a* through 160*d*) of second-level channels 150 are provided, i.e., one for each of the first-level channels 140*a* through 140*d*. Each second-level channel 150 is configured to receive a respective input signal 152 and to provide a respective output signal 154.

Summers 170 are configured to add together the second-level output signals 154 for each group 160 of second-level channels 150. The signals 154 all have the same sampling rate and may be added directly. For example, summer 170*a* adds together the output signals 154 of the second-level channels 140 for group 160*a*, summer 170*b* adds together the output signals 154 of the second-level channels 140 for group 160*b*, summer 170*c* adds together the output signals 154 of the second-level channels 140 for group 160*c*, and summer 170*d* adds together the output signals 154 of the second-level channels 140 for group 160*d*. In addition, a summer 180 is configured to sum together first-level output signals 144 from the first-level channels 140 to produce a composite output signal 182 (the signals 144 all have the same sampling rate). The composite output signal 182 contains a composite of multiple communications signals, such as all 32 signals.

In the example shown, the composite output signal 182 and the outputs of the first-level channels 140 all have a sampling rate $F_{S1}$ of 625 MSPS (mega-samples per second) and bandwidth range $BW_1$ of 500 MHz (+/−250 MHz). Sampling rate and frequency decrease from right to left in the figure. Input signals 142 to the first-level channels 140 (and the output signals 154 of the second-level channels 150) have a sampling rate $F_{S2}$ of 156.25 MSPS and a bandwidth range $BW_2$ of 100 MHz (+/−50 MHz), reflecting a 4:1 up-sampling and frequency multiplication performed by the first-level channels 140. Also, input signals 152 of the second-level channels 150 have a sampling rate $F_{S3}$ of 39.0625 MSPS and a bandwidth range $BW_2$ of 25 MHz (+/−12.5 MHz), reflecting a 4:1 up-sampling and frequency multiplication performed by the second-level channels 150.

In an example, the first-level channels 140 and the second-level channels 150 are tunable, such that they can place their respective narrower-band input signals in any desired ranges of their respective wider-band output signals. For example, each of the first-level channels 140 can place its respective input signal (at $BW_2$ of 100 MHZ) anywhere within the wider bandwidth range of its output signal ($BW_1$ of 500 MHZ). Likewise, each of the second-level channels 150 can place its respective input signal (at $BW_3$ of 25 MHZ) anywhere within the wider bandwidth range of its output signal ($BW_2$ of 100 MHZ). Thus, the first-level channels 140 and the second-level channels 150 can be tuned to distribute the communication signals in any desired manner within $BW_1$.

In the figure, the input stage 130 provides 16 second-level input signals 152 to 16 respective second-level channels 150 at $F_{S3}$ and $BW_3$. Some of the second-level input signals 152 may themselves be composite signals (combined using the switch matrix). In some examples, the input stage 130 may provide additional signals, such as one or more high-band signals 144H and/or one or more mid-band signals 154M. The high-band signals 144H have sampling rate $FS_1$ and bandwidth $BW_1$ and thus may be added directly to other signals 144 by the summer 180. The mid-band signals 154M have sampling rate $FS_2$ and bandwidth $BW_2$ and thus may be added directly to other signals 154 by any of the summers 170.

In some examples, the synthesizer 100 further includes an output stage 190 configured to up-sample the composite output signal 182 and to modulate the up-sampled signal onto a carrier (e.g., 850 MHz) to produce a high-frequency output signal 192. In some examples, the output signal 192 is provided to other RF/microwave circuitry (not shown) within the instrument or in other instruments or hardware.

One should appreciate that the signals shown in FIG. 1 may be realized in a variety of formats, such as in polar format, in which signals have one real-value component, or in rectangular format, in which signals have two components, an in-phase component (I) and a quadrature component (Q). In an example, the signals shown in FIG. 1 are maintained in rectangular format and are only translated to polar format when converting digital signals to analog signals.

Figure 2:
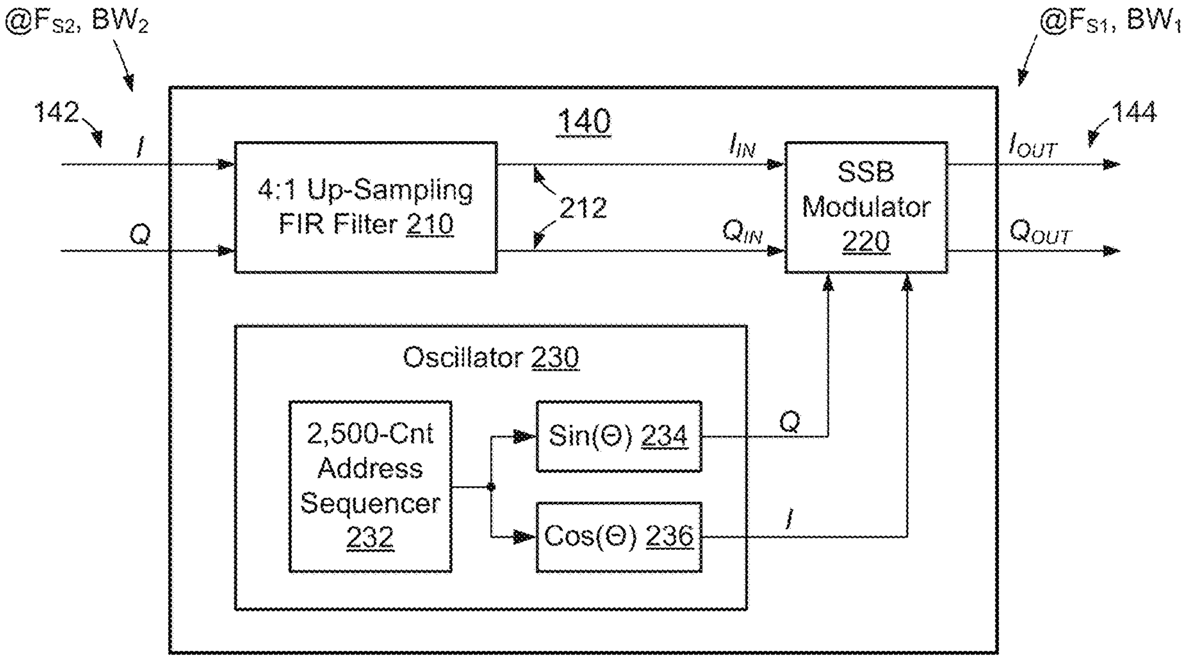
FIG. 2 is a block diagram of an example first-level channel of FIG. 1 according to certain embodiments.

FIG. 2 shows an example first-level channel 140 in greater detail. The depicted first-level channel 140 is intended to be representative of all first-level channels 140*a* through 140*d* shown in FIG. 1. Here, the first-level channel 140 receives a rectangular input signal 142 at $F_{S2}$, $BW_2$, and produces a rectangular output signal 144 at $F_{S1}$, $BW_1$. To this end, the first-level channel 140 includes an up-sampling FIR (finite impulse response) filter 210, an SSB modulator 220, and an oscillator 230.

The FIR filter 210 is configured to perform a 4:1 upsampling of the input signal 142 to produce an up-sampled signal 212, e.g., by inserting 3 zeroes after each sample of the input signal 142 and low-pass filtering the result. An amplitude gain of 4 may be applied to avoid signal-size reduction. In some examples (not shown), the FIR filter 210 may be implemented as two series-connected stages, with each stage performing a 2:1 up-sampling function. Providing two 2:1 stages may be more efficient than providing a single 4:1 stage in some cases, as fewer filter coefficients are needed overall.

The SSB modulator 220 is configured to perform signal multiplication and addition for modulating the up-sampled input signal 212 to a higher frequency. Further details about SSB modulators are presented in FIG. 4.

The oscillator 230 is configured to produce a tunable frequency, in this case frequencies in the range between +/−250 MHz. To provide this functionality efficiently, the oscillator 230 preferably takes a simplified form. Instead of providing a conventional DDS that requires a phase accumulator and many arithmetic operations, the oscillator 230 instead uses an address sequencer 232 followed by sine and cosine lookup tables 234 and 236, respectively.

The address sequencer 232 is a clocked circuit configured to cycle through a set of memory locations (2,500 locations in this example) and to output the value stored at each memory location to the sine and cosine tables 234 and 236, returning to the first memory location immediately after reaching the last memory location in a continuous cycle. The memory locations store values that correspond to phase (e.g., degrees, radians, etc.). The sine and cosine tables 234 and 236 output sine and cosine values (Q and I) that correspond to the phase values (Θ).

The number of 360-degree phase spans stored in the memory locations determines the frequency of the oscillator's output. For example, if the 2,500 addresses store only a single 360-degree span (e.g., where 0 corresponds to 0 degrees and 2,499 corresponds to 2,499/2,500 of 360 degrees), then the oscillator 230 would produce a first frequency. If the 2,500 locations store two 360-degree spans, then the oscillator 230 would produce a second frequency that is twice the first frequency. If the 2,500 addresses store a constant value, the output would be 0 Hz (DC). Preferably, the number of sine and cosine values stored in the tables 234 and 236 is the same as the number of addresses (2,500), although this is not required. Also, the same values may be shared between the tables 234 and 236, once offsets for phase differences between sine and cosine are accounted for. As used here, the term "sinusoid" and its variants refer to both sine waves and cosine waves. Both sines and cosines are sinusoidal.

In an example, the 2,500-count sequencer 232 is implemented using four 625-count sequencers that run in parallel. The parallel arrangement allows each sequencer 232 to be clocked at one-quarter the rate, placing the clock speed well within capabilities of available FPGAs.

Applying 2,500 counts of the sequencer 232 to the 500 MHz output range ($BW_1$) provides a frequency resolution of 500 MHz/2,500=250 kHz. Although this frequency resolution is coarse, it is still sufficient given that the input stage 130 provides much finer resolution (e.g., $1/16^{th}$ Hz), and the finer resolution controls the overall resolution as seen in the composite signal 182.

Figure 3:
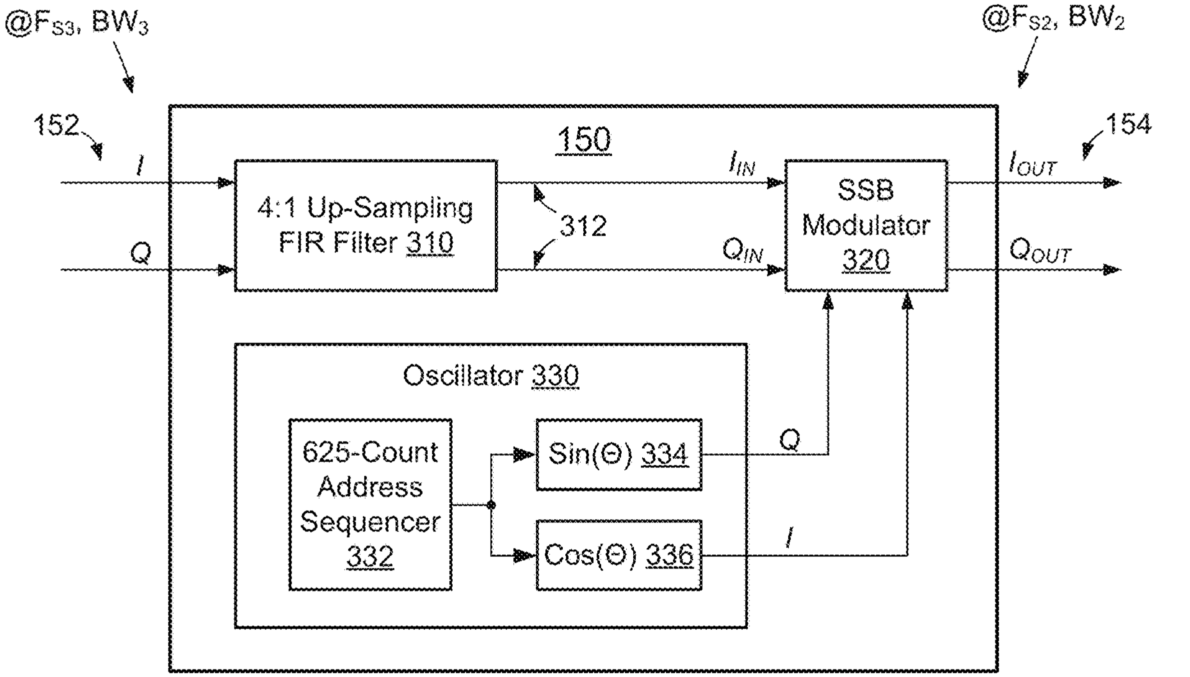
FIG. 3 is a block diagram of an example second-level channel of FIG. 1 according to certain embodiments.

FIG. 3 shows an example second-level channel 150 in greater detail and is intended to be representative of all second-level channels 150 in all groups 160 shown in FIG. 1. Here, the second-level channel 150 receives a rectangular input signal 152 at $F_{S3}$, $BW_3$, and provides a rectangular output signal 154 at $F_{S3}$, $BW_2$. To this end, the second-level channel 150 includes an FIR (finite impulse response) filter 310, an SSB modulator 320, and an oscillator 330. The FIR filter 310 and SSB modulator 320 are similar to the FIR filter 220 and SSB modulator 220 described in connection with FIG. 2, except that the need operate at only one-quarter the frequency and thus may be simpler to implement. The oscillator 330 is similar to the oscillator 230, except that it uses only a 625-count address sequencer 332, which has one-quarter the number of values and operates at one-quarter the rate of the sequencer 232. Sine and cosine tables 334 and 336 may include 625 values each. Alternatively, the sine and cosine tables 234 and 236 may be reused here, e.g., by using every fourth value in the tables.

Applying 625 counts of the sequencer 332 to the 100 MHz output range ($BW_2$) provides a frequency resolution of 100 MHz/625=250 kHz, which is the same as the frequency resolution of the oscillator 230. Again, this level of resolution is sufficient given that the input stage 130 provides much finer resolution (e.g., $1/16^{th}$ Hz), and the finer resolution controls the overall resolution seen at the output in the composite signal 182.

Figure 4:
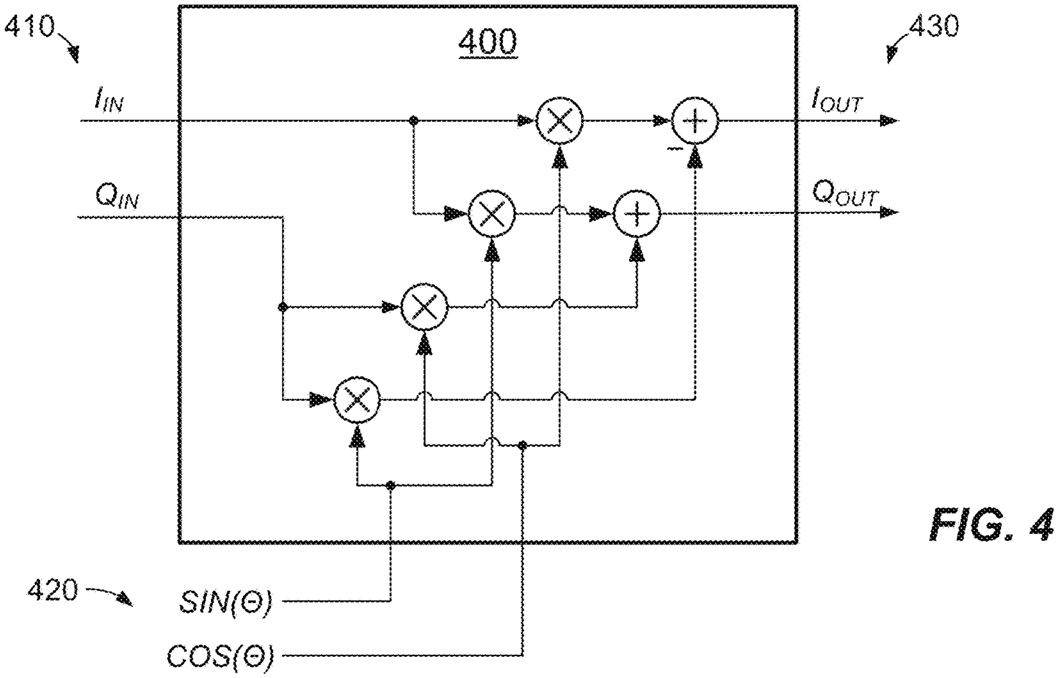
FIG. 4 is a block diagram of an example single-sideband (SSB) modulator according to certain embodiments.
Figure 5:
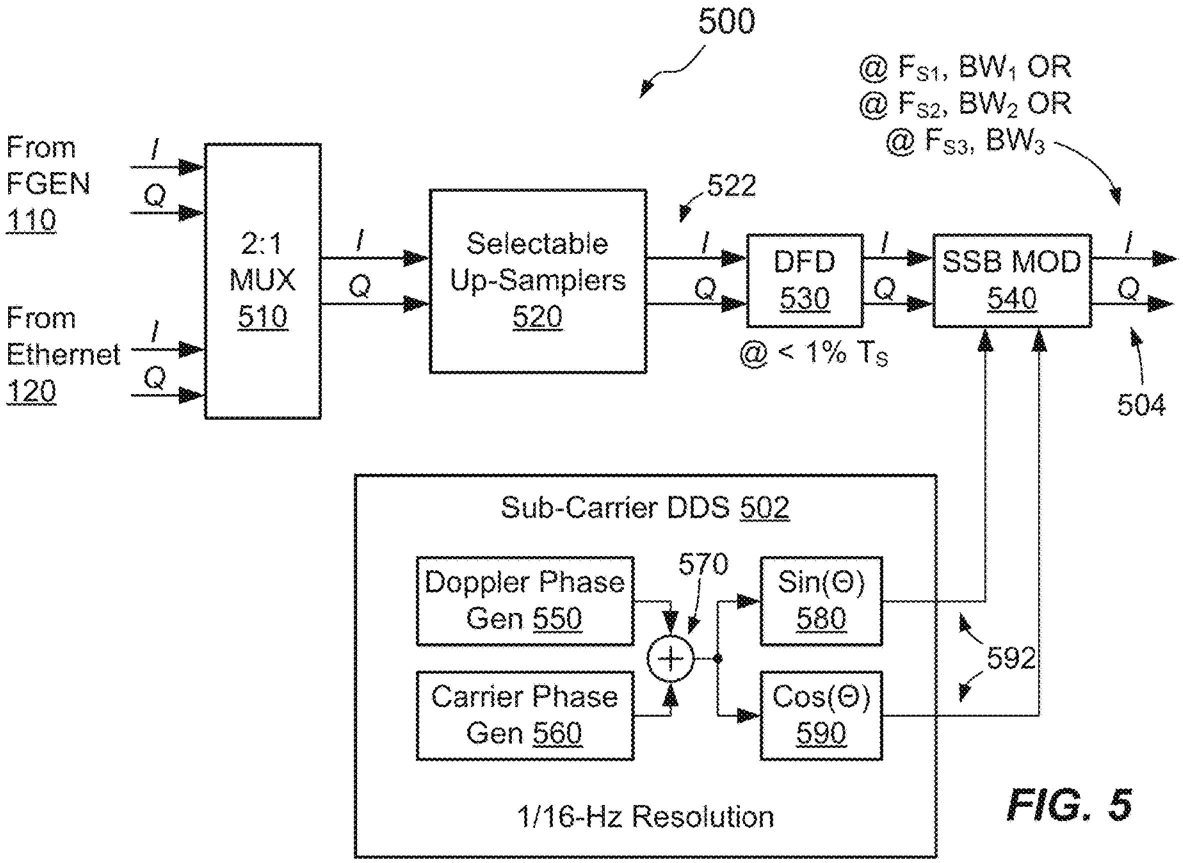
FIG. 5 is a block diagram of an example input processing stage of FIG. 1 according to certain embodiments.

FIG. 4 shows an example SSB modulator 400, which may be used in any parts of the design that call for an SSB modulator, e.g., 220, 320, and 540 (FIG. 5). As shown, the SSB modulator 400 receives a modulation input signal 410 ($I_{IN}$, $Q_{IN}$) and a carrier (or sub-carrier) input signal 420 and generates a modulated output signal 420 ($I_{OUT}$, $Q_{OUT}$). The SSB modulator 440 processes the inputs 410 and 420 to produce the output 430 as follows:

$$I_{OUT} = I_{IN}\,\mathrm{Cos}(\Theta) - Q_{IN}\,\mathrm{Sin}(\Theta);$$

and

-continued $$Q_{OUT} = I_{IN}\,\mathrm{Sin}(\Theta) + Q_{IN}\,\mathrm{Cos}(\Theta),$$

where Sin(Θ) and Cos(Θ) are components of the carrier input signal 420.

FIG. 5 shows an example input channel 500 of the input stage 130. The input stage 130 may include multiple input channels 500 like the one shown, such as 32 input channels. The input channels 500 may be configured to operate at various frequencies and sampling rates.

As shown, the input channel 500 includes a 2:1 mux 510, selectable up-samplers 520, a digital fine delay (DFD) circuit 530, an SSB modulator 540, and a sub-carrier DDS 502. The 2:1 mux 510 is provided for selecting between input from the function generator 110 and input from Ethernet 120. Input from the function generator 110 may be restricted to certain input channels 500, such as one or more high-band channels (those providing signals 144H; see FIG. 1). Thus, the mux 510 may be omitted from certain input channels 500.

The selectable up-samplers 520 are configured to selectively up-sample an input signal 512 to produce an up-sampled signal 522. For example, if the signal 512 has a sampling rate less than 39.0625 MSPS, the up-samplers 520 may be arranged to up-sample the signal to 39.0625 MSPS, such that the signal can be provided as a second-level input signal 152 to a second-level channel 150. If the signal 512 has a sampling rate less than 156.25 MSPS, the up-samplers 520 may be arranged to up-sample the signal to 156.25 MSPS, such that the signal can be provided as a mid-band signal 154M to the input of a first-level channel 140. Similarly, if the signal 512 has a sampling rate less than 625 MSPS, the up-samplers 520 may be arranged to up-sample the signal to 625 MSPS, such that the signal can be provided as a high-band signal 144H to the summer 180. Normally, the smallest amount of up-sampling is applied for reaching the nearest target sampling rate (39.0625 MSPS, 156.25 MSPS, or 625 MSPS). The design is intended to be flexible, however.

Another consideration behind the desired degree of upsampling is spectral fill. As is known, "spectral fill" is the ratio of a signal's frequency to the Nyquist rate for sampling that signal. The Nyquist rate is the highest frequency that a sampled signal can contain while still maintaining the ability to fully reproduce the signal from its samples. The Nyquist rate is computed as one-half the sampling rate, given that at least two samples per period are needed to reproduce a sinusoid having that period. The Nyquist rate is an ideal limit that is not achievable in practice, however, as it requires infinitely sharp filters to avoid aliasing. A signal sampled at the Nyquist rate has a spectral fill of 100%. Likewise, a signal sampled at twice the Nyquist rate has a spectral fill of 50%. Preferably, the up-samplers 520 are configured to produce signals with spectral fill no greater than 32%.

Once the up-samplers 520 have achieved a desired level of upsampling, the up-sampled signal 522 is variably delayed by DFD 530, which delays the signal 522 by selectable increments of time. In an example, such increments are based on the sampling period of the up-sampled signal 522, which may be divided into at least 100 equal time increments (preferably 1024 increments).

The delayed output from the DFD 530 is then modulated by SSB modulator 540, which shifts the frequency range of the delayed signal to a target range that is specific to the input channel 500, such as a subrange within +/−12.5 MHZ ($BW_3$), +/−50 MHZ ($BW_2$), or +/−250 MHz ($BW_1$). Output 504 from the SSB modulator 540 is then fed to the appropriate input of FIG. 1, e.g., as a signal 152, 144, 144H, or 154H.

To achieve the frequency shifting, the sub-carrier DDS 502 provides a sub-carrier signal 592 to the SSB modulator 540. The sub-carrier DDS 502 is configured to produce sub-carrier frequencies tuned over a defined frequency range with fine frequency resolution, such as $1/16^{th}$ Hz resolution (the defined frequency range depends on the particular channel 500). Unlike the simplified DDSs (also called oscillators) 230 and 330 described above, the sub-carrier DDS 502 preferably includes a phase accumulator, such as a 36-bit phase accumulator. A carrier phase generator 560 includes the phase accumulator and generates increasing phase values in fine increments. A Doppler phase generator 550 generates phase values related to Doppler (e.g., simulated motion toward or away from a receiver). A summer 570 adds the phase values together and provides them to sine and cosine tables 580 and 590, respectively. The sine and cosine tables 580 and 590 provide their respective sinusoidal output (as a rectangular signal) in the sub-carrier 592.

One should appreciate that the composite output signal 182 of FIG. 1 directly reflects the frequency resolution and delays that are applied by the input channel 500. The upsampling and SSB modulation provided by the first-level channels 140 and second-level channels 150 increase sampling rates and shift their input signals to different frequency bands, placing them as desired within respective bandwidth windows, but they do not otherwise alter the signals 504, which retain the frequency resolution and delays applied by the input circuits 500.

Figure 6:
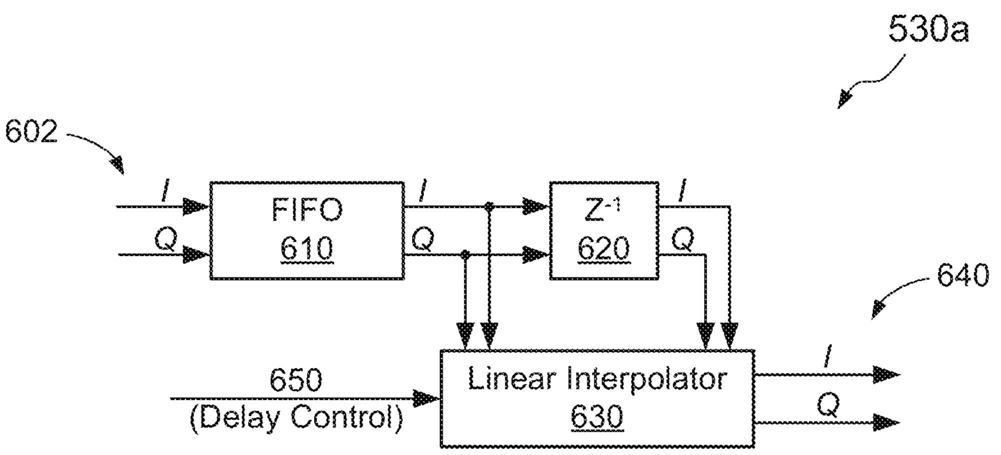
FIG. 6 is a block diagram of an example digital fine delay (DFD) circuit that uses linear interpolation according to certain embodiments.
Figure 7:
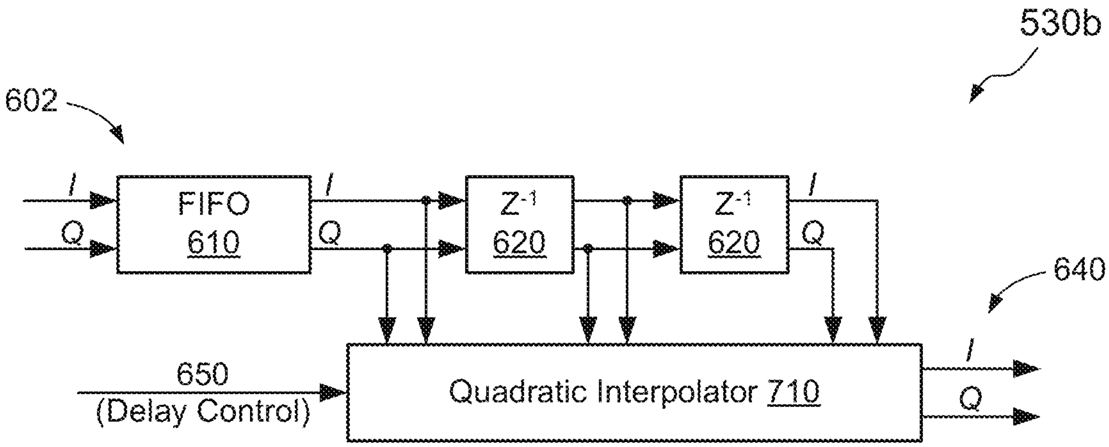
FIG. 7 is a block diagram of an example digital fine delay (DFD) circuit that uses quadratic interpolation according to certain embodiments.

FIGS. 6 and 7 show examples of the DFD circuit 530 in greater detail. Starting with FIG. 6, a first-order DFD 530*a* is shown, which is configured to perform linear (i.e., straight-line) interpolation between successive samples of an input signal 602, such as the up-sampled signal 522 of FIG. 5, and to produce a delayed output signal 640, such as the input to the SSB modulator 540. As shown, the DFD 530*a* includes a FIFO (first-in, first-out buffer), a unit-delay (z−1) 620, and a linear interpolator 630. The FIFO 610 is provided for regularizing samples of the input signal 602, which may otherwise contain timing jitter or other timing errors. The FIFO 610 may be omitted if regularity of the samples is otherwise achieved.

The unit delay 620 is configured to delay the output of the FIFO 610 by a single sample period, $T_S$. As both the input and the output of the unit-delay 620 are coupled to the linear interpolator 630, the interpolator 630 sees two successive samples separated by precisely $T_S$. A control input 650 establishes a desired delay. For example, the linear interpolator 630 includes a series of 1024 taps, and a control input 650 of 0 represents zero delay while an input of 1023 represents a delay of approximately $T_S$. The programmed value 650 thus establishes the signal delay in the output 640.

Preferably, the linear DFD 630 is used for input signals 602 having spectral fill of no greater than 16%, which corresponds to 12.5 samples per sinusoidal period. Spectral fill values above 16% may have too few samples per cycle for linear estimates to produce accurate results.

FIG. 7 shows quadratic DFD 530*b*, which is configured to perform second-order (quadratic) interpolation. Unlike linear interpolation, which uses two consecutive samples, quadratic interpolation uses three consecutive samples. Thus, two unit-delays 620 are provided in series, and a quadratic interpolator 710 operates on three consecutive samples at a time. As the higher-order interpolation provides more accurate results, the DFD 530*b* may be used with spectral fill as high as 32% (6.25 samples per sinusoidal period). However, given the second-order interpolation is more resource intensive than first-order interpolation, DFD 530*b* preferably is used only in cases where the spectral fill is between 16% and 32% (32% is the maximum spectral fill encountered for DFDs in this design). Although higher-order DFDs may be realized, they provide diminishing returns given their higher complexity and provide no clear benefit for spectral fill less than about 32%.

Figure 8:
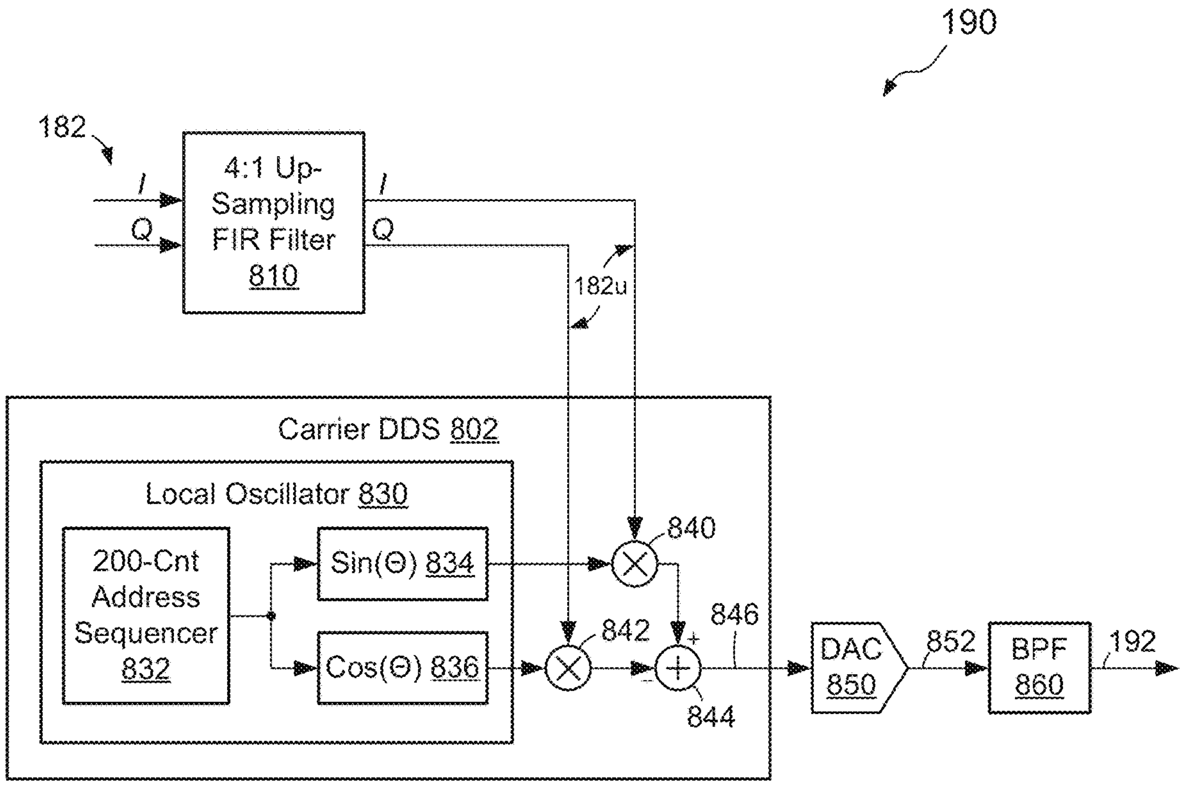
FIG. 8 is a block diagram of an example output processing stage of FIG. 1 according to certain embodiments.

FIG. 8 shows an example output stage 190 which may be used in certain embodiments. As shown, the output stage 190 receives the composite output signal 182 and generates an analog output signal 192. A 4:1 up-sampling FIR filter 810, similar in design to the FIR filters 210 and 310, up-samples the composite signal 182 and provides an up-sampled composite signal 182*u*. A carrier DDS 802 modulates the up-sampled signal 182*u* at a carrier frequency, which may be a fixed 850 MHz, for example. A carrier DDS 802 performs the modulation. For example, a local oscillator 830 generates the carrier frequency using the simplified DDS described above in connection with oscillators 230 and 330. The local oscillator 830 uses a 200-count address sequencer 832 with sine and cosine tables 834 and 836. Output of the sine and cosine tables provides the carrier frequency. The address sequencer 832 may use a small number of counts (200), as no frequency tuning is required. Modulation is achieved using multipliers 840 and 842, and a summer 844 combines the multiplication results by subtracting the cosine-derived component from the sine-derived component. With this arrangement, the summer 844 performs a rectangular-to-polar conversion, expressing the output signal 846 in polar coordinates, i.e., as a real-value signal. A DAC 850 converts the real-value signal 846 to an analog signal 852, and a bandpass filter (or low-pass filter) 860 smooths the DAC output to provide the output signal 192, which may feed other functions of the instrument or to other instruments.

Figure 9:
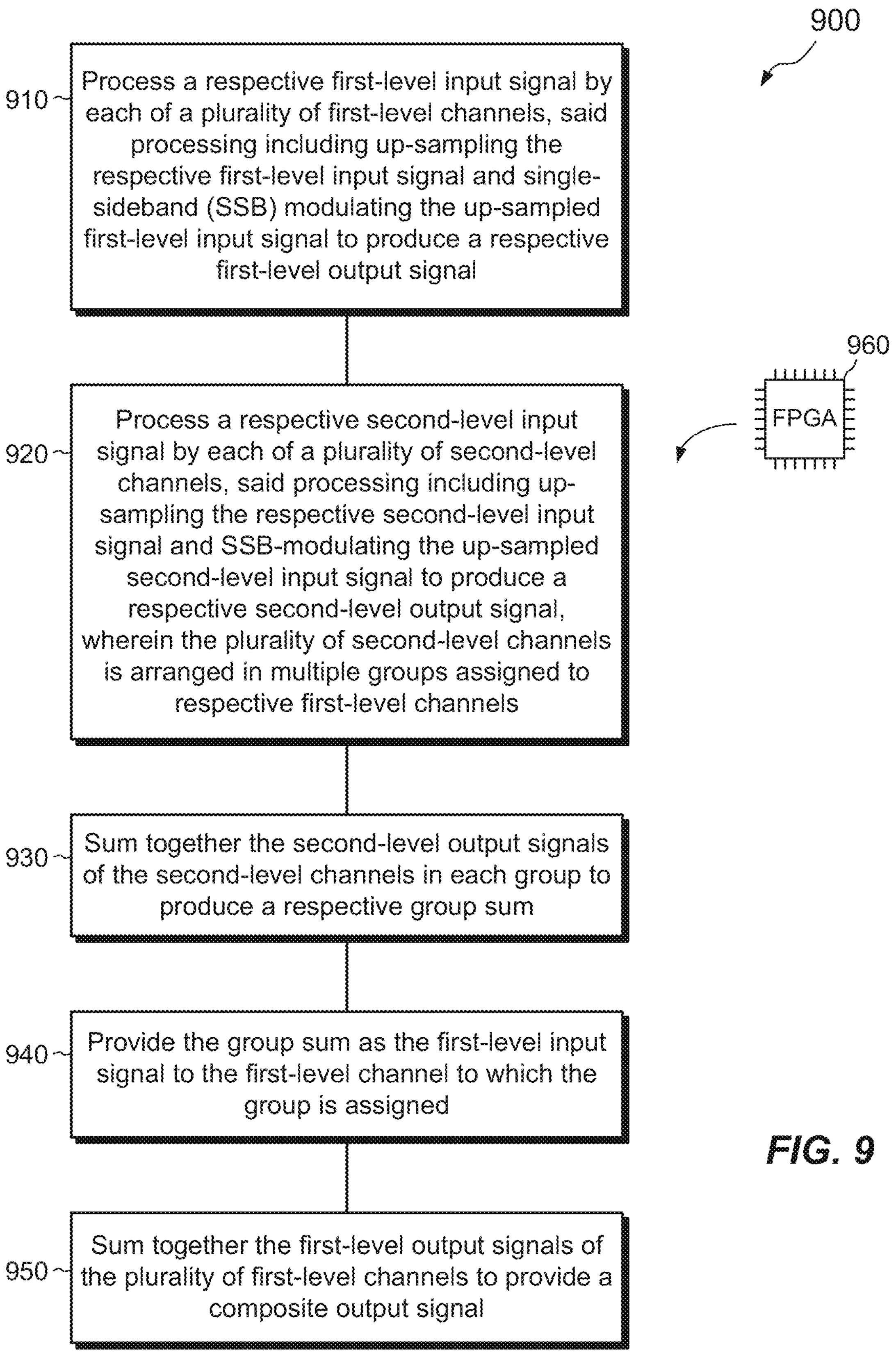
FIG. 9 is a flowchart showing an example method of generating electronic signals according to certain embodiments.

FIG. 9 shows an example method 900 that may be carried out in connection with the synthesizer 100 and provides an overview of some of the features described above. The various acts of method 900 may be ordered in any suitable way. Accordingly, embodiments may be constructed in which acts are performed in orders different from that illustrated, which may include performing some acts simultaneously.

At 910, a respective first-level input signal 142 is processed by each of a plurality of first-level channels 140. Such processing includes up-sampling the respective first-level input signal 142 (e.g., using an upsampling FIR filter 210) and single-sideband (SSB) modulating the up-sampled first-level input signal 212 (e.g., using SSB modulator 220 and oscillator 230) to produce a respective first-level output signal 144.

At 920, a respective second-level input signal 152 is processed by each of a plurality of second-level channels 150. Such processing includes up-sampling the respective second-level input signal 152 (e.g., using an upsampling FIR filter 310) and SSB-modulating the up-sampled second-level input signal 312 (e.g., using SSB modulator 320 and oscillator 330) to produce a respective second-level output signal 154. The plurality of second-level channels 150 is arranged in multiple groups 160 assigned to respective first-level channels 140.

At 930, the second-level output signals 154 of the second-level channels 150 in each group 160 are summed together (e.g., via summers 170) to produce a respective group sum.

At 940, the group sum provides a first-level input signal 142 to the respective first-level channel 140.

At 950, the first-level output signals 144 of the plurality of first-level channels are summed together (e.g., by summer 180) to provide a composite output signal 182.

In some examples, the method 900 may be embodied as a computer program product including one or more non-transient, computer-readable storage media 960, such as a magnetic disk, magnetic tape, compact disk, DVD, optical disk, flash drive, solid state drive, SD (Secure Digital) chip or device, Application Specific Integrated Circuit (ASIC), Field Programmable Gate Array (FPGA), and/or the like. Any number of computer-readable media may be used. The media may be encoded with software or firmware instructions which, when executed on one or more computers or other processors, or when operated as part of an instrument, perform the process or processes described herein. Such media may be considered articles of manufacture or machines, and may be transportable from one machine to another.

An improved technique has been described for generating communication signals. The technique includes preparing a multitude of communication signals (e.g., signals 152, 144H, and 154M) at relatively low sampling rates, and then upsampling, modulating, and combining the signals in successive stages at successively higher sampling rates. Although processing higher sampling-rate signals is more resource-intensive than processing lower sampling-rate signals, there are fewer higher sampling-rate signals, such that the resources required overall are much less than would be needed if each communication signal were prepared independently at the higher sampling rate.

Having described certain embodiments, numerous alternative embodiments or variations can be made. For example, although certain numbers of first-level channels, second-level channels, and input channels 500 have been described, these are provided merely for illustrative purposes and may easily be varied by those who benefit from this disclosure. Also, although certain bandwidth ranges, sampling-rate ranges, up-sampling ratios, sub-carrier frequencies, and carrier frequencies are described, these also are merely examples, which others may easily vary within the scope of this disclosure.

Further, although features have been shown and described with reference to particular embodiments hereof, such features may be included and hereby are included in any of the disclosed embodiments and their variants. Thus, it is understood that features disclosed in connection with any embodiment are included in any other embodiment.

As used throughout this document, the words "comprising," "including," "containing," and "having" are intended to set forth certain items, steps, elements, or aspects of something in an open-ended fashion. Also, as used herein and unless a specific statement is made to the contrary, the word "set" means one or more of something. This is the case regardless of whether the phrase "set of" is followed by a singular or plural object and regardless of whether it is conjugated with a singular or plural verb. Also, a "set of" elements can describe fewer than all elements present. Thus, there may be additional elements of the same kind that are not part of the set. Further, ordinal expressions, such as "first," "second," "third," and so on, may be used as adjectives herein for identification purposes. Unless specifically indicated, these ordinal expressions are not intended to imply any ordering or sequence. Thus, for example, a "second" event may take place before or after a "first event," or even if no first event ever occurs. In addition, an identification herein of a particular element, feature, or act as being a "first" such element, feature, or act should not be construed as requiring that there must also be a "second" or other such element, feature or act. Rather, the "first" item may be the only one. Also, and unless specifically stated to the contrary, "based on" is intended to be nonexclusive. Thus, "based on" should be interpreted as meaning "based at least in part on" unless specifically indicated otherwise. Further, although the term "user" as used herein may refer to a human being, the term is also intended to cover non-human entities, such as robots, bots, and other computer-implemented programs and technologies. Although certain embodiments are disclosed herein, it is understood that these are provided by way of example only and should not be construed as limiting.

Those skilled in the art will therefore understand that various changes in form and detail may be made to the embodiments disclosed herein without departing from the scope of the following claims.

What is claimed is:

1. A synthesizer for generating electronic signals, comprising:

a plurality of first-level channels, each of the plurality of first-level channels constructed and arranged to up-sample and single-sideband (SSB) modulate a respective first-level input signal to produce a respective first-level output signal;

a plurality of second-level channels, each of the plurality of second-level channels constructed and arranged to up-sample and SSB-modulate a respective second-level input signal to produce a respective second-level output signal, the plurality of second-level channels arranged in multiple groups wherein each group is provided for a respective first-level channel and includes multiple second-level channels whose second-level output signals combine to provide the first-level input signal of the respective first-level channel; and a summer constructed and arranged to sum together the first-level output signals to produce a composite output signal.

2. The synthesizer of claim 1, wherein the composite output signal has a first bandwidth range, wherein the first-level input signal of each first-level channel has a second bandwidth range that is narrower than the first bandwidth range, and wherein each first-level channel is further constructed and arranged to place the respective first-level input signal within a respective subrange of the first bandwidth range of the composite signal.

3. The synthesizer of claim 2, wherein each second-level channel in a group is constructed and arranged to receive a second-level input signal having a third bandwidth range that is narrower than the second bandwidth range, and wherein each second-level channel in the group is further constructed and arranged to place the respective second-level input signal within a respective subrange of the second bandwidth range.

4. The synthesizer of claim 1, wherein each of the plurality of first-level channels includes:

an up-sampler configured to multiply a sampling rate of the respective first-level input signal to produce a respective up-sampled first-level input signal;

an oscillator that includes (i) an address sequencer configured to cycle through a sequence of stored values and (ii) a set of lookup tables that associates the stored values with respective sinusoidal values; and an SSB modulator having inputs configured to receive the up-sampled first-level input signal and the sinusoidal values and an output configured to produce the respective first-level output signal.

5. The synthesizer of claim 1, wherein each of the plurality of first-level channels and each of the plurality of second-level channels respectively includes an oscillator that includes (i) an address sequencer configured to cycle through a sequence of stored values and (ii) a set of lookup tables that associates the stored values with respective sinusoidal values.

6. The synthesizer of claim 5, wherein the stored values correspond to phase, and wherein the address sequencer is constructed and arranged to output the values at a consistent clock rate.

7. The synthesizer of claim 6, wherein the address sequencer is constructed and arranged to output a value at a first address after outputting a value from a last address, such that the address sequencer operates in a continuous loop.

8. The synthesizer of claim 7, wherein the oscillator is programmable for producing different frequencies of sinusoids by storing different numbers of 360-degree phase cycles in the stored values.

9. The synthesizer of claim 5, further comprising an input circuit constructed and arranged to produce the second-level input signal of a second-level channel of the plurality of second-level channels, the input circuit including a direct digital synthesizer (DDS) constructed and arranged to generate a sub-carrier frequency having a frequency resolution, wherein a component of the composite output signal contributed by the second-level channel has the same frequency resolution as the sub-carrier frequency produced by the DDS.

10. The synthesizer of claim 1, further comprising:

an up-sampler constructed and arranged to receive the composite output signal and to multiply a sampling rate of the composite output signal to provide an upsampled composite signal;

a carrier DDS constructed and arranged to modulate the up-sampled composite signal on a carrier frequency; and a digital-to-analog converter constructed and arranged to convert the modulated, up-sampled composite signal to an analog signal.

11. The synthesizer of claim 10, wherein the modulator includes a local oscillator constructed and arranged to generate the carrier signal, the local oscillator including (i) an address sequencer configured to cycle through a sequence of stored values and (ii) a set of lookup tables that associates the stored values with respective sinusoidal values.

12. The synthesizer of claim 1, further comprising an input circuit constructed and arranged to produce the second-level input signal of a second-level channel of the plurality of second-level channels, the input circuit including:

a direct digital synthesizer (DDS) constructed and arranged to generate a sub-carrier frequency;

a digital fine delay (DFD) circuit having an input coupled to a signal source for receiving an input signal having a sampling period; and an SSB modulator having a first input coupled to the DFD circuit, a second input coupled to the DDS, and an output coupled to the second-level channel for providing the second-level input signal, wherein the DFD circuit is constructed and arranged to selectively delay the input signal by time increments that are less than one percent of the sampling period of the input signal.

13. The synthesizer of claim 1, further comprising a digital fine delay (DFD) circuit having an input coupled to a signal source for receiving an input signal and an output coupled to one of the second-level channels for providing a delayed signal, wherein the DFD circuit includes:

a FIFO (first-in, first out buffer), the FIFO having an input configured to receive successive samples of the input signal and an output configured to provide delayed versions of the successive samples;

a unit-delay circuit having an input and an output, the input of the unit-delay circuit coupled to the output of the FIFO; and a linear time interpolator having a first input coupled to the output of the FIFO, a second input coupled to the output of the unit-delay circuit, a third input providing a control signal for selecting a desired delay, and an output configured to provide the delayed signal delayed by an amount of time based on the control signal.

14. The synthesizer of claim 13, wherein the input signal provided to the input of the DFD circuit has a spectral fill that does not exceed 16%.

15. The synthesizer of claim 1, further comprising a digital fine delay (DFD) circuit having an input coupled to a signal source for receiving an input signal and an output coupled to one of the first-level channels for providing a delayed signal, the input signal having a spectral fill between 16% and 32%, wherein the DFD circuit includes:

a FIFO (first-in, first out buffer), the FIFO having an input configured to receive successive samples of the input signal and an output configured to provide delayed versions of the successive samples;

a first unit-delay circuit having an input and an output, the input of the unit-delay circuit coupled to the output of the FIFO;

a second unit-delay circuit having an input and an output, the input of the second unit-delay circuit coupled to the output of the first unit-delay circuit; and a quadratic time interpolator having (i) a first input coupled to the output of the FIFO, (ii) a second input coupled to the output of the first unit-delay circuit, (iii) a third input coupled to the output of the second unit-delay circuit, and (iv) a fourth input providing a control signal for selecting a desired delay, the quadratic time interpolator further having an output configured to provide the delayed signal delayed by an amount of time based on the control signal.

16. A method of generating electronic signals, comprising:

processing a respective first-level input signal by each of a plurality of first-level channels, said processing including up-sampling the respective first-level input signal and single-sideband (SSB) modulating the up-sampled first-level input signal to produce a respective first-level output signal; and processing a respective second-level input signal by each of a plurality of second-level channels, said processing including up-sampling the respective second-level input signal and SSB-modulating the up-sampled second-level input signal to produce a respective second-level output signal, wherein the plurality of second-level channels is arranged in multiple groups assigned to respective first-level channels, and wherein the method further comprises (i) summing together the second-level output signals of the second-level channels in each group to produce a respective group sum, (ii) providing the group sum as the first-level input signal to the first-level channel to which the group is assigned, and summing together the first-level output signals of the plurality of first-level channels to provide a composite output signal.

17. The method of claim 16, wherein the composite output signal has a first bandwidth range, and wherein the method further comprises:

generating the second-level input signal of a particular second-level channel of the plurality of second-level channels, said generating including modulating an input signal using a sub-carrier having a frequency resolution; and processing the second-level input signal by the particular second-level channel and an associated first-level channel to appear within a sub-range of the first bandwidth range of the composite output signal, wherein the second-level input signal appearing within the sub-range of the first bandwidth range of the composite output signal has the same frequency resolution as the sub-carrier.

18. The method of claim 17, wherein generating the second-level input signal of the particular second-level channel further includes delaying the input signal by programmable increments that are less than one percent of the sampling period of the input signal, wherein delaying the input signal by the programmable increments causes the second-level input signal appearing within the sub-range of the first bandwidth range of the composite output signal to be delayed by equal increments.

19. The method of claim 17, wherein SSB-modulating each up-sampled first-level input signal includes generating a respective sub-carrier frequency, and wherein generating the respective sub-carrier frequency for a particular first-level channel includes:

cycling through a sequence of stored values that correspond to a first number of sinusoidal cycles; and converting the sequence of stored values to a set of sinusoids having a frequency based on the first number.

20. The method of claim 19, further comprising varying the sub-carrier frequency of the particular first-level channel by storing values that correspond to a second number of sinusoidal cycles different from the first number.

* * * * *